United States Patent [19]

Hanak

[11] Patent Number: 4,754,544
[45] Date of Patent: Jul. 5, 1988

[54] EXTREMELY LIGHTWEIGHT, FLEXIBLE SEMICONDUCTOR DEVICE ARRAYS

[75] Inventor: Joseph J. Hanak, Birmingham, Mich.

[73] Assignee: Energy Conversion Devices, Inc., Troy, Mich.

[21] Appl. No.: 913,046

[22] Filed: Sep. 29, 1986

Related U.S. Application Data

[62] Division of Ser. No. 696,390, Jan. 30, 1985, abandoned.

[51] Int. Cl.$^4$ .................. H01L 21/56; H01L 31/18; H01L 21/96
[52] U.S. Cl. ........................................ 437/2; 136/244; 136/251; 136/249; 136/258; 437/228
[58] Field of Search ............... 29/572, 577 R, 580, 29/588, 590, 591; 136/251, 244, 249 MS, 258 AM

[56] References Cited

U.S. PATENT DOCUMENTS

| | | | |
|---|---|---|---|
| 4,257,156 | 3/1981 | Houston | 29/580 |
| 4,281,208 | 7/1981 | Kuwano et al. | 136/249 |
| 4,514,579 | 4/1985 | Hanak | 136/249 |
| 4,562,637 | 1/1986 | Kushima et al. | 29/572 |

FOREIGN PATENT DOCUMENTS

| | | | |
|---|---|---|---|
| 55-111181 | 8/1980 | Japan | 136/251 |
| 56-69874 | 6/1981 | Japan | 136/251 |
| 2155688 | 9/1985 | United Kingdom | 29/588 |

Primary Examiner—Aaron Weisstuch
Attorney, Agent, or Firm—Marvin S. Siskind; Richard M. Goldman

[57] ABSTRACT

An extremely lightweight, interconnected array of semiconductor devices, such as solar cells, is formed from a large continuous area of semiconductor material disposed on an unconventionally thin, electrically conducting substrate. The interconnections are formed by removing portions of the substrate to form substrate islands underlying a layer of semiconductor material which underlies a transparent conductive oxide. The oxide layer may likewise be formed into mutually isolated islands that overlay the areas between the substrate islands. Individual units or cells so formed may be interconnected by depositing a conducting material on, alongside and at least partially between islands of oxide and/or semiconductor, by depositing a metal grid on the oxide layer and burning conducting paths to the substrate islands, or by piercing the layers and disposing a conducting material in the holes pierced.

The unconventionally thin substrate may be a sheet of electroformed nickel or other thin metal or an initially thick substrate that is thinned by chemical etching after other array processing steps are completed. An encapsulant is preferably applied to the exposed surface of the semiconducting material to protect it while the substrate is being thinned or removed. Subsequently, an encapsulant is applied to the rear of substrate side of the array.

10 Claims, 8 Drawing Sheets

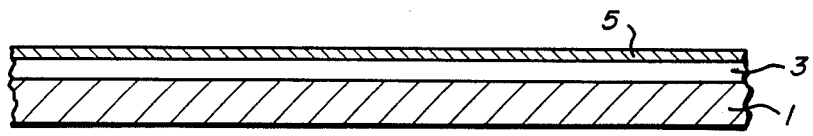
FIG. IA
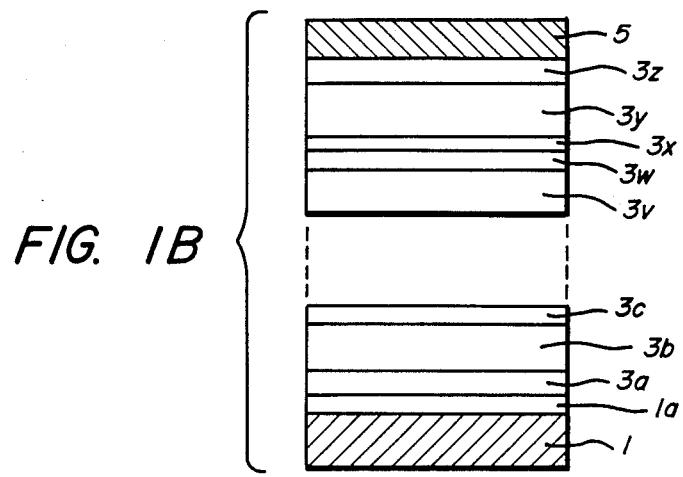
FIG. IB
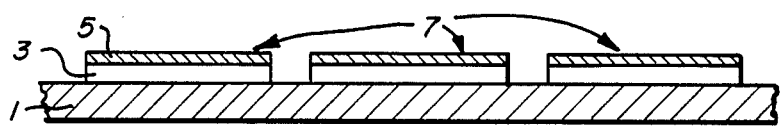
FIG. IC
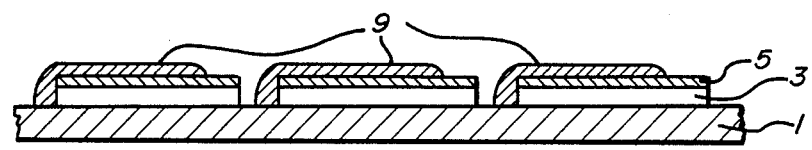
FIG. ID
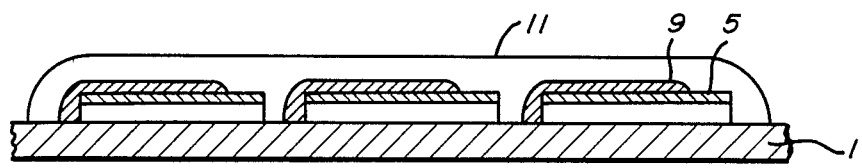
FIG. IE
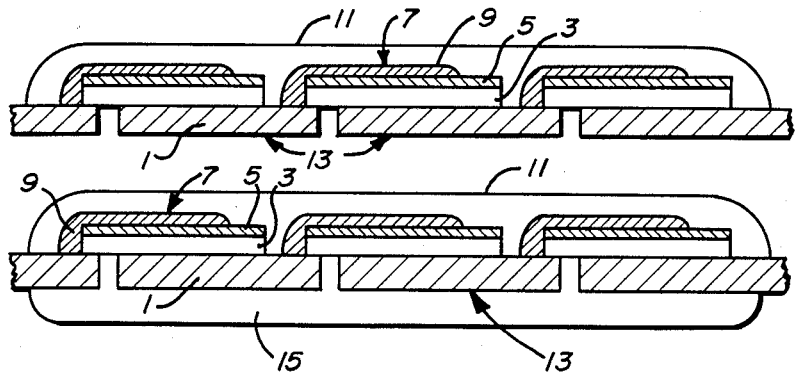
FIG. IF
FIG. IG

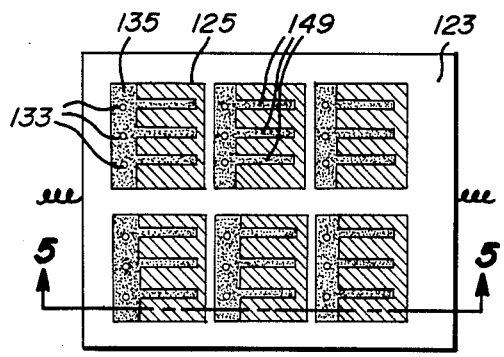
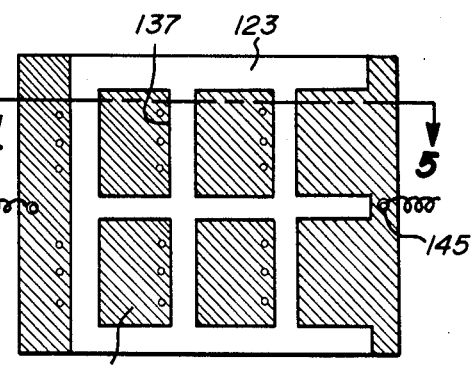
FIG. 6A  FIG. 6B
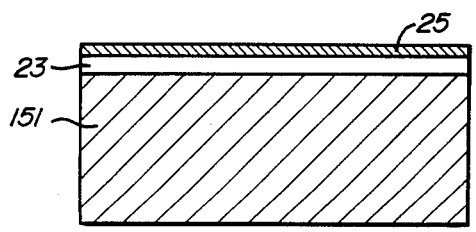
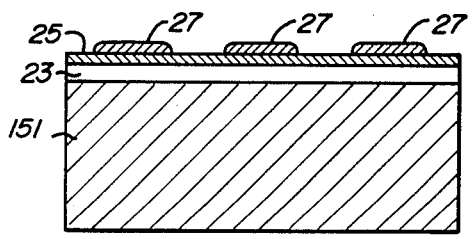
FIG. 7A  FIG. 7B
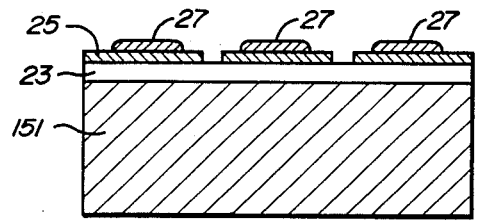
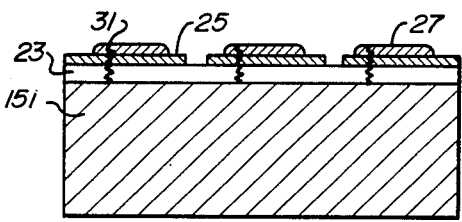
FIG. 7C  FIG. 7D
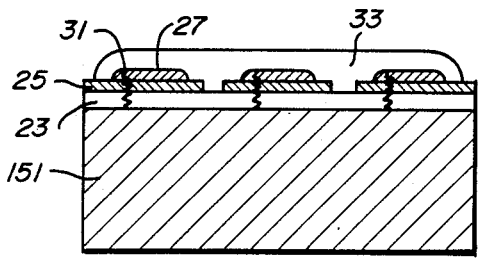
FIG. 7E
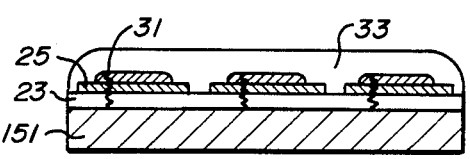
FIG. 7F
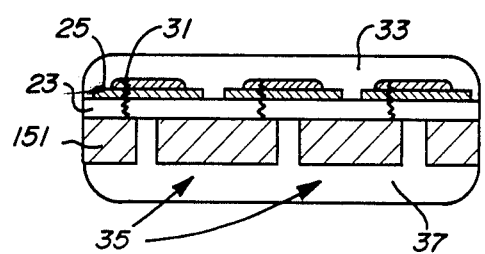
FIG. 7G

EXTREMELY LIGHTWEIGHT, FLEXIBLE SEMICONDUCTOR DEVICE ARRAYS

CROSS-REFERENCE TO RELATED APPLICATION

This is a division of U.S. patent application Ser. No. 696,390, filed Jan. 30, 1985, now abandoned.

BACKGROUND OF THE INVENTION

This invention relates to arrays of interconnected semiconductor devices such as photovoltaic cells for direct conversion of sunlight into electrical energy. It is known that large area solar cell arrays can be produced on glass and relatively thick metal substrates. For example, such arrays may be produced by depositing an amorphous silicon alloy on coils of metal strips that may be unrolled for deposition and rolled again after the deposition. See U.S. Pat. Nos. 4,410,558 for Continuous Amorphous Solar Cell Production System; 4,419,530 for Solar Cell and Method of Producing Same; 4,443,652 for Electrically Interconnected Large Area Photovoltaic Cells and Method of Producing Said Cells; and 4,485,125 for Method of Continuously Producing Tandem Amorphous Photovoltaic Cells, the disclosures of which are incorporated herein by reference. It is also known that amorphous silicon can be deposited on thin foils of nickel prepared by an electroforming technique. See U.S. Pat. No. 4,530,739 for Electroplated Substrate, which is incorporated herein by reference. It has also been reported that amorphous silicon may be deposited by glow discharge on narrow plastic sheets 15 micrometers in thickness that are continuously drawn through a low pressure deposition chamber. See U.S. Pat. No. 4,341,588.

Various methods of forming electrically interconnected arrays of small-area photovoltaic cells from relatively large areas of deposited photoresponsive semiconducting materials are known. For example, in my U.S. Pat. No. 4,514,579 and incorporated herein by reference, I have disclosed a "checkerboard" array of series-connected rows of photovoltaic cells in which the rows are electrically connected in parallel. Other series-connected arrays are disclosed in U.S. Pat. No. 4,245,386 to Kausche et al.

Traditionally, photovoltaic cells have been fabricated on a substrate that may be electrically conducting or may be an insulator. Typically, the substrate is the thickest member of a cell or an array of cells and contributes most of the weight to the cell or array. In applications where weight is an important or critical factor, such as extraterrestrial or certain consumer uses, it is desirable to minimize the weight of a photovoltaic array, which means minimizing the weight of the substrate. A particularly lightweight, interconnected array of devices could be made if the substrate were made unconventionally thin or a conventional substrate were eliminated entirely. However, use of a very thin substrate or no conventional substrate at all results in substantial difficulty in handling a large area of semiconductor material and forming it into an interconnected array.

In the invention, the problems of processing arrays of cells with an unconventionally thin substrate or without a conventional substrate are solved. Various alternative methods for producing such arrays have been developed. Arrays according to the invention are flexible and lightweight, permitting them to be rolled for storage in a relatively small volume. Because the weight of the inventive photovoltaic arrays is small, the specific power, i.e. output power divided by weight, is very large and provides an apt factor for measuring performance. It is also possible according to the invention to maximize the specific power of a photovoltaic array by eliminating a conventional substrate entirely.

SUMMARY OF THE INVENTION

In the present invention various methods have been devised for dividing a large area continuous sheet of semiconductor material, which may include one or more junctions between differing conductivity type materials, that has been deposited on an unconventionally thin electrically conducting substrate, into an interconnected array of semiconductor devices, such as photovoltaic cells. The interconnections are achieved in part by coating the exposed surface of the semiconductor material with an electrically conducting material. In the case of photovoltaic cells, the conductive coating must transmit visible light and may be a conductive oxide. Islands of the conductive coating and/or semiconductor are formed by removing material down to the next layer, then electrical connections from the islands to the substrate are established. The substrate is then formed into a series of islands.

It is an important feature in some embodiments of the invention that the areas between the substrate islands underlie the islands of semiconductor and/or conductive coating. This feature, combined with the island-to-substrate electrical connection, results in a series interconnection of the array of devices that are individually formed by the islands of semiconductor and/or conductive coating. The array thus formed is encapsulated for protection in a glassy or polymer encapsulant. It is preferred that the interconnections be entirely formed on the conductive coating/semiconductor surface before encapsulation of that side and before forming islands of the substrate. Thereby maximum mechanical stability is achieved on the surface of the array while its opposite surface is being treated. The increased strength achieves better mask registration in the etching steps. It is also preferred that any masking steps be carried out before any encapsulation to avoid exposure of the encapsulant to heat used in mask curing or to solvents used to remove masks. It is also preferred in some embodiments to avoid etching of the semiconductor so that the conductive coating and substrate are not exposed to corrosive substances.

Among the methods disclosed for achieving the interconnection from the conductive coating and/or semiconductor islands to the substrate are the deposition of an electrically conductive material on, alongside and at least partially between aligned islands of conductive coating and semiconductor; depositing a metal grid on islands of the conductive coating and establishing conducting paths through the semiconductor to the substrate, as by high current fusion or high power laser illumination; depositing the conductive coating on and between islands of semiconductor and removing the conductive coating over portions of the semiconductor islands; and piercing the substrate and semiconductor adjacent the islands of conductive coating material and inserting a conducting paste in the pierced channels.

The sheet of semiconductor material from which the interconnected array is formed may be an amorphous alloy deposited on a relatively thin, such as 10 micrometers thick strip of metal or other conductor. It may also be a relatively thick strip of metal on the order 250 micrometers thick that is reduced in thickness to 10 micrometers or less by chemical etching before or after the conductive coating is encapsulated. In an extreme case, an electrically conductive layer, preferably an optically reflective layer, is first deposited on a support layer having a chemical composition different from that of the layer. The support layer may be a substrate of conventional thickness. Then the semiconductor material and conductive coating are deposited. Before or during the processing of the semconductor sheet, the support layer is removed by an etchant that does not attack the reflecting layer. As a result, an extremely lightweight array is produced having the reflecting layer as an unconventional, extraordinarily thin substrate. Preferably the etching is performed after the opposite side of the structure has been encapsulated so that there is maximum mechanical strength to protect the array during processing.

A conventional substrate may also be eliminated by depositing the optically reflective layer on a support layer, such as conventional metallic substrate, coated with a insulator, such as a polyimide. The array is then processed according to the invention to form interconnections between individual photovoltaic cells. In this embodiment, the spaces between the islands of "substrate" do not lie below islands of conductingcoating since the insulator does not permit access to the reflective layer from the rear of the array. The support layer, i.e. conventional substrate, is entirely removed, leaving the insulator to add strength to the array and encapsulate one side of it, but adding little weight. In either "substrateless" case, the optically reflecting layer is formed into islands to effect the interconnection of the cells in the array.

The arrays formed according to the process are lightweight since they include only an unconventionally thin or no substrate, and preferably no more than a few hundred nanometers of semiconductor material. If, as is preferred, the semiconductor material is an amorphous alloy, the structure is quite flexible and can be repeatedly rolled into a small diameter tube for storage and unrolled for use without damage.

BRIEF DESCRIPTION OF THE DRAWINGS

FIGS. 1A through 1G are schematic cross-sectional end views, showing the steps in the fabrication of an interconnected array according to one embodiment of the invention.

FIG. 6A is a top view and FIG. 6B is a bottom view of an interconnected array according to one embodiment of the invention.

FIGS. 7A through 7G are schematic cross-sectional end views, showing the steps in the fabrication of an interconnected array according to one embodiment of the invention.

DETAILED DESCRIPTION OF PREFERRED EMBODIMENTS

Figure 2A:
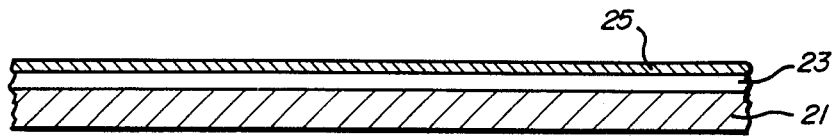
FIGS. 2A through 2F are schematic cross-sectional end views, showing the steps in the fabrication of an interconnected array according to one embodiment of the invention.
Figure 2B:
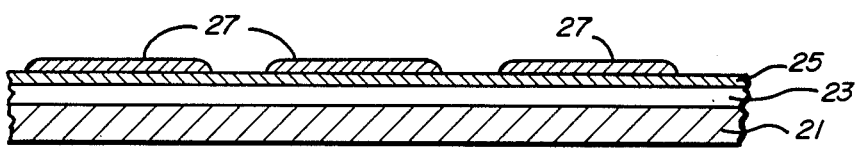
Figure 2C:
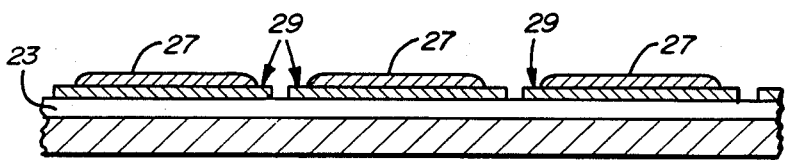
Figure 2D:
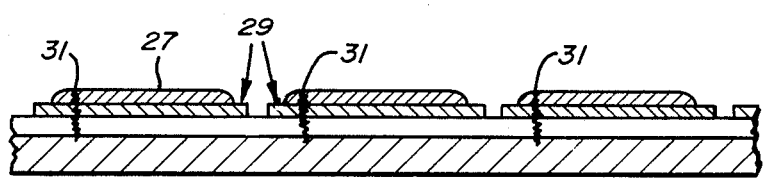

In the invention a substrate is used for receiving a layer of semiconductor material. The substrate may be unconventionally thin or may be a conventionally thick substrate that is made unconventionally thin, preferably by chemical etching. In some embodiments, the conventional substrate may be removed entirely, preferably by chemical etching leaving an unconventional, extraordinarily thin substrate. When the substrate is not completely removed, it is formed into islands for electrically interconnecting electronic devices, such as photovoltaic cells. When the substrate is completely removed, a conducting layer, preferably optically reflecting, is formed into islands to act as an unconventional substrate for electrically interconnecting the devices that form the array. The semiconductor material may be formed into islands as part of the process of forming the devices and interconnecting them.

As used here, the term "island" means an isolated unit of the material that constitutes the island. That is, when a continuous sheet of semiconductor material or a substrate is formed into a plurality of islands, some of the semiconductor or substrate is removed completely, in a direction generally perpendicular to length and width of the sheet, to expose the next subjacent, different kind of material. For example, forming islands of semiconductor material exposes substrate in the areas between those islands.

It is preferred, but not required, that the semiconductor be an amorphous silicon or germanium alloy because those alloys can be readily deposited in very thin continuous layers or sheets covering large areas. Furthermore, those layers can be doped in a controlled way and single and multiple $p-n$ and $p-i-n$ structures can be created in them. It is also now known how to deposit amorphous silicon structures on electroformed nickel sheets that are no thicker than 10 micrometers. These techniques are disclosed in the U.S. patents described above and incorporated herein by reference. Thin layers of amorphous semiconductor alloys may be flexed without significant damage. All these properties aid in producing a lightweight, flexible array of devices according to the invention.

A continuous sheet of metal substrate and semiconductor material may be formed into an array of interconnected devices by numerous inventive methods as illustrated in the drawing figures. All of the figures are merely schematic and none are drawn to scale. In practice, the semiconductor material, conductive coatings, and back reflectors are all tens and hundreds of nanometers thick, whereas the substrates are tens of thousands of nanometers thick. The drawing figures depict the formation of islands of various layers having sidewalls perpendicular to the next underlying layer. As those skilled in the art will appreciate, when the islands are formed by chemical etching, the sidewalls develop a non-perpendicular slope with respect to the next underlying layer.

Turning to FIG. 1, a series of six processing steps is illustrated by showing in cross-sectional end view a structure including semiconductor material, preferably an amorphous silicon alloy containing defect compensating constituents, such as hydrogen and/or fluorine, to give performance equal to that of crystalline silicon. The structure, as shown in FIG. 1A, includes an unconventionally thin electrically conducting substrate 1, preferably a metal such as stainless steel. In this example, the substrate is of an unconventional thickness e.g. less than 50 micrometers thick. The substrate may be an electroformed nickel sheet no thicker than 10 micrometers. A layer of semiconductor 3 is deposited on substrate 1. As shown in FIG. 1B and as applicable to all processes and devices described here, semiconductor 3 may contain a series of layers 3a, 3b, . . . 3y, 3z and substrate 1 may support a layer 1a intermediate the substrate and semiconductor. For example, layers 3a, 3b, etc, may be of differing conductivity types to form one or more n—p, p—n, p—i—n or n—i—p junction structures or p—p+ and n—n+ junctions might be used as ohmic contacts. The junctions are generally disposed in parallel opposition to substrate 1. Intermediate layer 1a could be an electrically conducting or insulating material. When the devices to be prepared are photovoltaic cells, layer 1a is preferably an optically reflective material that enhances the performance of the cells and may include an underlying insulating material, as described in connection with two of the embodiments of the invention disclosed here.

As shown in FIG. 1A, an electrically conductive coating 5 has been deposited on semiconductor 3 opposite substrate 1 to aid formation of electrical contacts. If the devices to be prepared according to the invention are to be photovoltaic devices, conductive coating 5 must be transparent to electromagnetic radiation, such as visible light, and may be a conductive oxide such as indium tin oxide, antimony tin oxide, or cadmium tin oxide.

In the illustrated procedure, the conductive coating and semiconductor are formed into a plurality of coextensive islands 7, as shown in FIG. 1C, by removing portions of the coating and semiconductor down to substrate 1. That is, in this example, the semiconductor in each island lies directly beneath and is of the same size as each island of conductive material. The island formation may be accomplished by any known technique such as use of photosensitive masks followed by chemical etching or by scribing with a laser or water jet.

Next, as shown in FIG. 1D, each island 7 is electrically connected to substrate 1. In this example a conductive material 9, preferably a highly conductive material such as a metal, is deposited on each island 7, along its side and at least partially between adjacent islands and in contact with the part of substrate 1 exposed between adjacent islands. Because of the relatively high lateral resistance of thin layers 3 and 5, the electrical connection along the side wall of islands 7 does not adversely affect performance of the device being formed at each island. Conductive material 9 may be deposited by known methods such as screen printing a paste or condensing an evaporated metal on the structure, using conventional masking techniques. Although conductive material 9 appears in FIGS. 1D through 1G to obscure most of the exposed surface of islands 7, material 9 is actually formed in fingers that are shown in cross section in the figures. As a result, the fingers obscure only a small fraction of the top surface of coating 5.

Then, as shown in FIG. 1E, a protective insulative encapsulant 11 is applied to the side of the structure opposite substrate 1. The encapsulant may be a glassy material, such as silicon dioxide, silicon nitride, or silicon carbide, deposited by known techniques, or a polymer film. Such films include polyesters, polyurethanes, fluorocarbons, polyimides, and ethylene vinyl acetate (EVA) that may be thermally bonded or adhered to the structure to fill in all voids. It is useful to apply the encapsulant at this point in processing to provide maximum mechanical strength to the flexible assembly for further processing steps. If the devices in the array are solar cells, then the encapsulant must transmit light as some glasses and the polymeric encapsulants do.

To complete the interconnection, islands 13 of substrate 1 are formed (FIG. 1F). In order to make the desired electrical connection between the cells, it is important that the areas between islands 13 underlie islands 7 of semiconductor material 3. The substrate islands are formed by conventional techniques such as masking and chemical etching.

As a visual inspection of FIG. 1F shows, the individual devices are electrically connected in series as a result of the processing just described. Although only an end view of the array is shown in FIG. 1F, it is understood that a plurality of series-connected strings of devices as shown may be connected in parallel to form a series-parallel array. In the case of photovoltaic cells, the series-parallel connections may be chosen to produce a desired voltage and current output and are tolerant of many defects in individual cells as disclosed in my U.S. Pat. No. 4,514,579.

Finally, as shown in FIG. 1G, an encapsulant 15 is applied to the substrate side of the assembly. The encapsulant may be a glassy material or a polymer like EVA, but need not be transparent. Obviously, it is necessary to apply an electrical connection to each of the two substrate islands at opposite ends of the series-connected string to prepare a useable array. These contacts may be applied by conventional means.

Another method of forming an interconnected array is shown in FIG. 2 in six parts, 2A through 2F. The same starting material is used as in FIG. 1A. In FIG. 2A, an unconventionally thin conducting substrate 21 bears a semiconductor material 23 that may be an amorphous silicon alloy containing a number of junctions in parallel opposition to substrate 21. A conductive coating 25, which may be a transparent oxide, is deposited on semiconductor 23 as shown in FIG. 2B. A metal grid having a plurality of fingers 27 is deposited on coating 25, for example, by condensing a metal from a vapor and using conventional masks and etchants as necessary to establish the desired finger dimensions.

Islands 29 of coating 25 are formed beneath grid 27. As is preferred (but not shown in FIG. 2C), islands 29 project beyond the width of fingers 27. Each grid finger 27 is electrically connected to substrate 21 through coating 25 and semiconductor 23. The electrical connection is formed by "burning" a highly conducting path 31 from each finger 27 through coating 25 and semiconductor 23 to substrate 21. Paths 31 may be created by briefly passing a relatively large localized current through the path, much in the nature of spot welding. Alternatively, a high energy density laser beam may be directed at each finger 27 to form each of the highly conducting paths 31 that are shown schematically in FIG. 2D.

Figure 2E:
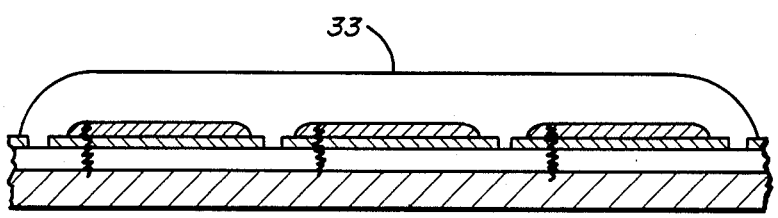
Figure 2F:
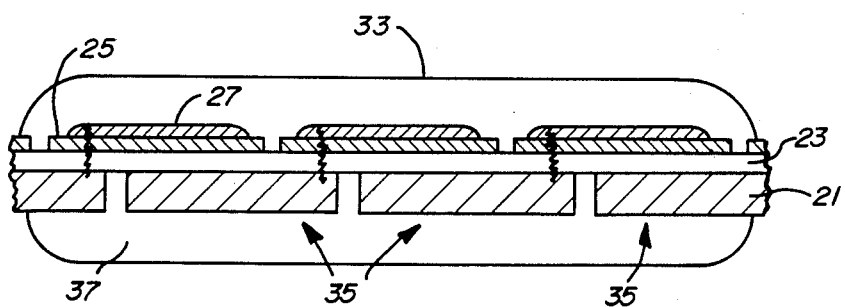

As already described in relation to FIG. 1, an encapsulant 33 is applied to the front surface of the structure opposite substrate 21. See FIG. 2E. Thereafter, islands 35 of substrate 21 are formed with the areas between islands 35 being disposed beneath islands 29 rather than being aligned with islands 29 (FIG. 2E). Islands 35 may be formed by conventional masking and etching techniques. Finally, as with the structure of FIG. 1, a rear encapsulant 37 is applied to the substrate side of the structure. Electrical contacts are applied to two substrate islands 35 at the extreme ends of the series-connected devices before the encapsulation.

Although the methods just described produce lightweight, flexible interconnected arrays of devices, sometimes wrinkling of the first applied encapsulant occurs while the substrate is being processed. By making some changes in the order of the process steps, encapsulant wrinkling can be avoided. Two such processes according to the invention are illustrated in FIGS. 3 and 4.

Referring to FIG. 3, there is the same beginning structure as before. An unconventionally thin, conducting substrate 41 has deposited on it a layer of semiconductor 43, preferably an amorphous silicon alloy that may include one or more differing conductivity type junctions. An electrically conductive coating 45 deposited on semiconductor 43 may be a transparent conductive oxide (FIG. 3A). The structure is then processed, for example, by laser scribing, water jet scribing, or conventional masking and etching, to form islands 47, each comprising coextensive islands of semiconductor material 43 and overlying conductive coating 45 (FIG. 3B). In order to perform as many processing steps as possible before encapsulation, the positions of islands of substrate 41 are next established by depositing a mask 49 on the substrate as shown in FIG. 3C. The mask is applied in a conventional way, for example, using well known photoresist masks, to establish the pattern for the substrate islands. As shown in FIG. 3C, mask 49 defines the substrate islands so that the spaces between them will be disposed beneath islands 47.

Figure 3A:
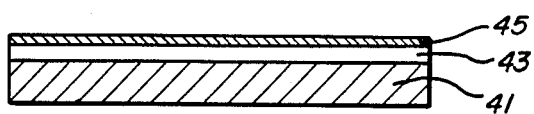
FIGS. 3A through 3G are schematic cross-sectional end views, showing the steps in the fabrication of an interconnected array according to one embodiment of the invention.
Figure 3B:
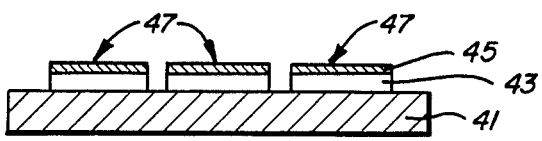
Figure 3C:
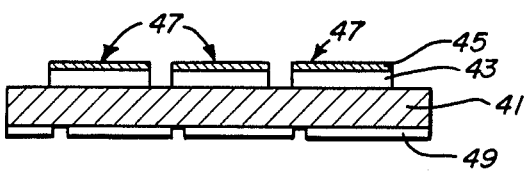
Figure 3D:
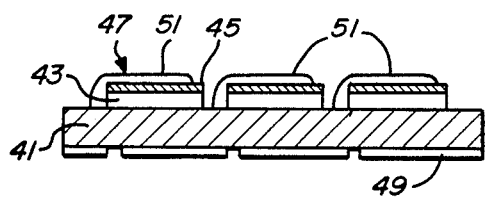

In FIG. 3D a step of depositing a metal 51 in electrical contact with substrate 41 between islands 47 and on top of each of islands 47 is shown. This is the same step described for FIG. 1D and may likewise be completed by condensing a metal vapor or by screen printing. Then an encapsulant 53 (see FIG. 3E), such as a glassy material or a polymer, is applied to the side of the structure bearing islands 47 as described in connection with FIGS. 1E and 1G. A polymer encapsulant may be applied with heat or an adhesive.

Figure 3E:
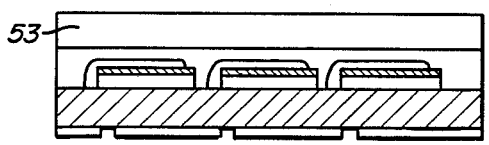
Figure 3F:
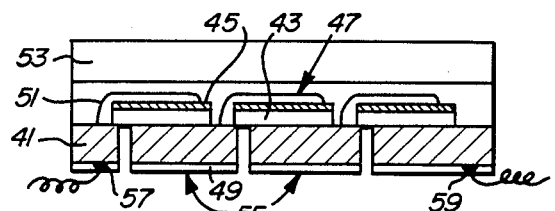

Islands 55 of substrate 41 are then formed by chemically etching the substrate (FIG. 3F). By applying mask 49 before encapsulation, encapsulant 53 is not subjected to the heat used to cure the mask and therefore does not wrinkle. Avoidance of wrinkling is important to produce a planar array and to obtain accurate mask registration. Mask 49 may also be left in place after etching to avoid exposure of encapsulant 53 to the solvent used to remove the mask. Electrical contacts 57 and 59 are applied to islands 55 at the extreme ends of the string, through mask 49, if necessary.

Figure 3G:
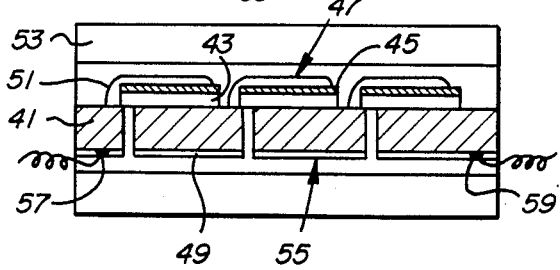

Finally, a glassy or polymeric encapsulant 61 is applied over the substrate side of the structure, much like encapsulant 53. As indicated in FIGS. 3E, 3F and 3G, encapsulant 53 may consist of two parts. A potting compound may be applied to the semiconductor side of the structure before a sheet encapsulant is applied. The potting compound will flow into the areas between islands 47 and eliminate voids. Since voids are potentially present between substrate islands 55 also, it may also be desirable to apply a potting compound to the substrate side of the structure before encapsulant 61 is applied.

A different embodiment of the invention in which the encapsulants are not exposed to thermal curing or solvents related to masking is illustrated in FIG. 4. There, the starting material shown in FIG. 4A is the same as in earlier examples, except that the conducting coating has not yet been applied.

Figure 4A:
FIGS. 4A to 4H are schematic cross-sectional end views, showing the steps i the fabrication of an interconnected array according to one embodiment of the invention.
Figure 4B:
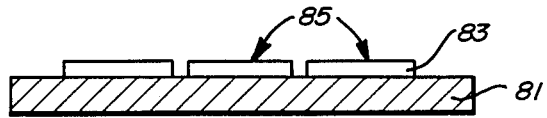
Figure 4C:
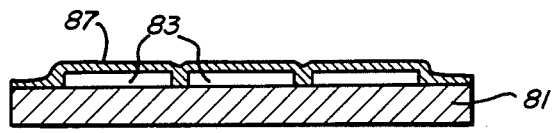

A substrate 81 has deposited on it a semiconductor material 83, that may be an amorphous silicon alloy and may contain one or more electrical junctions disposed in parallel oposition to substrate 81. Semiconductor 83 is divided into islands 85 by scribing with a laser or water jet or by conventional masking and etching techniques (FIG. 4B). Then an electrically conducting coating 87 is deposited over and between semiconductor islands 85 so as to be in electrical and mechanical contact with islands 85 and substrate 81 in the areas between islands 85 (FIG. 4C). In this way the top surface of each of islands 85 is electrically connected to substrate 81. However, islands 85 are not short circuited because of the high lateral resistance of thin semiconductor layer 83. Coating 87 may be a transparent conductive oxide such as indium tin oxide or one of the other oxides already identified herein.

Figure 4D:
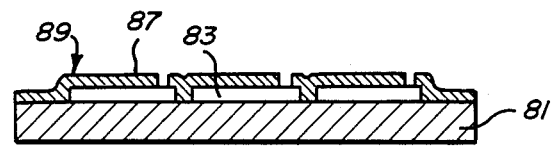
Figure 4E:
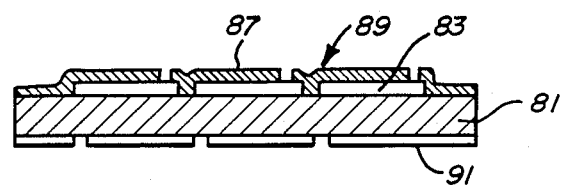

As shown schematically in FIG. 4D, coating 87 is formed into islands 89 by removing some of the coating material 87 lying directly over each of islands 85. Thereafter, a mask 91 is applied to substrate 81 for later use in forming substrate islands and the mask is cured as necessary. Conventional photoresist materials may be used as mask 91. As shown in FIG. 4E, the openings in mask 91 are aligned beneath islands 85 to produce, ultimately, a series electrical connection between at least some of the devices in the array being formed.

Figure 4F:
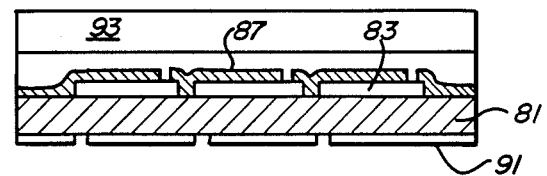

Upon completion of the masking step, an encapsulant 93 is applied to the conductive coating side of the structure (FIG. 4F). Encapsulant 93 may include a potting compound applied directly to the structure followed by a protective glassy or polymer film, or the glassy or polymer film may be applied directly to the structure.

Figure 4G:
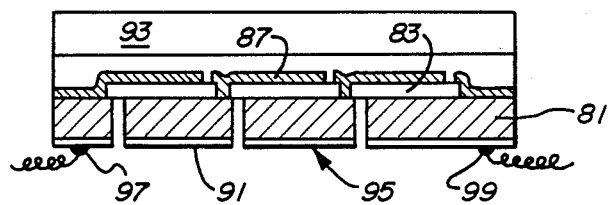
Figure 4H:
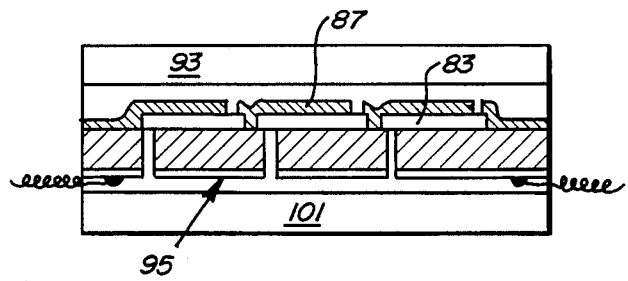

Thereafter, substrate 81 is etched through mask 91 to form islands 95 of substrate 81 (FIG. 4G). Because the spaces between islands 95 lie below semiconductor islands 85 and the spaces between conductor islands 89 lie above semiconductor islands 85, the result is a series-connected string of devices. Electrical contacts 97 and 99 are attached to substrate islands 95 at the extreme ends of the string. Finally, an encapsulant 101 is applied to substrate 81 (FIG. 4H). Again, mask 91 may be left in place to avoid exposing an encapsulant to any solvents, so long as electrical contacts 97 and 99 penetrate the mask to reach substrate 81. Encapsulant 101 may be a glassy material or polymer and may include a potting compound in direct contact with substrate 81.

Still other embodiments of the invention exist. It is desirable in some cases to avoid etching the semiconductor layer since that process requires use of corrosive liquids or semi-liquids that may attack a metal substrate. A process according to the invention that avoids etching of the semiconductor is depicted in FIG. 5.

Figure 5A:
FIGS. 5A to 5G are schematic cross-sectional end views, showing the steps in the fabrication of an interconnected array according to one embodiment of the invention.
Figure 5B:
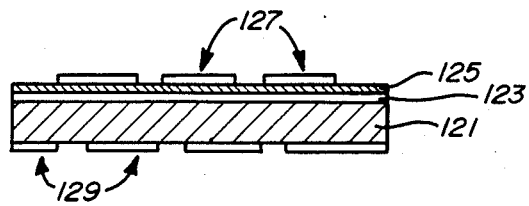

In FIG. 5A the usual starting material of an electrically conducting, preferably metal, unconventionally thin substrate 121 is shown bearing a semiconductor layer 123. As before, semiconductor 123 may be an amorphous silicon alloy and may contain one or more junctions disposed opposite substrate 121. An electrically conductive coating 125 is disposed on semiconductor 123 and may be a transparent conductive material such as indium tin oxide. As seen in FIG. 5B, masks are next applied to both sides of the structure. These may be conventional photoresist material masks. The mask on coating 125 is patterned to define islands 127. The mask on substrate 121 defines another set of islands 129. Again, the spaces between substrate mask islands 129 are disposed beneath mask islands 127 in order that the desired series electrical connection be produced in the final product.

Figure 5C:
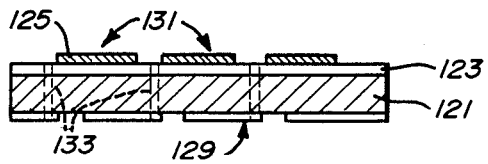

Transparent coating 125 is then etched through mask islands 127 with a mild etch (FIG. 5C). For example, a hydrogen iodide solution may be used to remove indium tin oxide and form coating islands 131. A channel 133 is formed adjacent each coating island 131 passing through semiconductor 123, substrate 121 and mask island 129. Channels 133 may be punched with a sharp instrument like a needle because of the thinness of the layers. Typically the total thickness of coating and semiconductor layer does not exceed a few hundred nanometers and the substrate typically is less than about 100 micrometers in thickness.

Figure 5D:
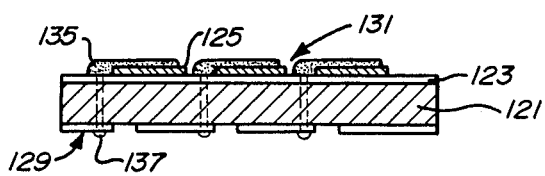

Channels 133 are filled with a conductive material such as a silver paste by a suitable method such as screen printing. The paste is forced into channels 133 and patterned so as to contact the top and side of coating islands 131 and to extend out of substrate mask islands 129 to form a raised contact point 137 at the substrate side of the structure (FIG. 5D).

Figure 5E:
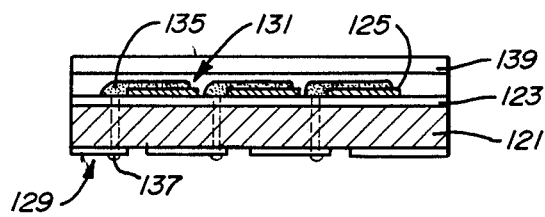
Figure 5F:
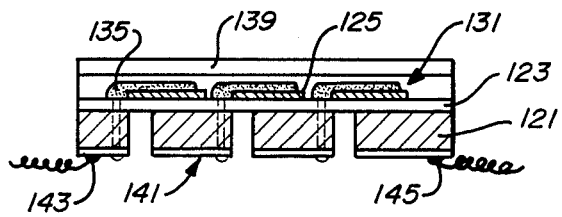
Figure 5G:
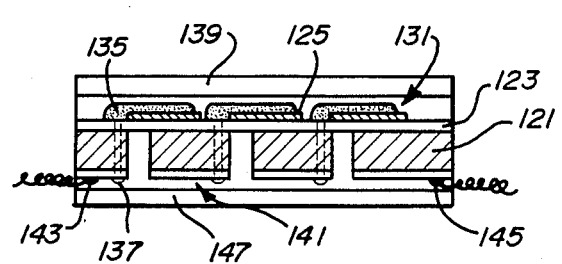
Figure 8A:
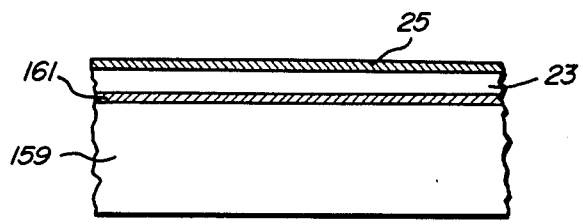
FIGS. 8A through 8G are schematic cross-sectional end views, showing the steps in the fabrication of an interconnected array according to one embodiment of the invention.
Figure 8B:
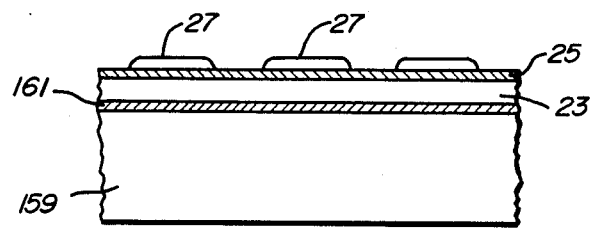
Figure 8C:
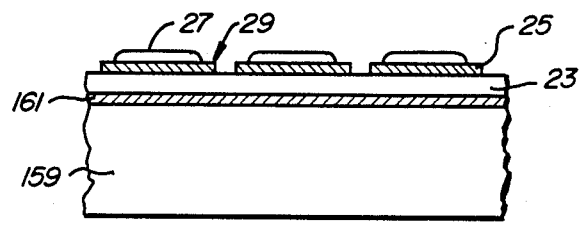
Figure 8D:
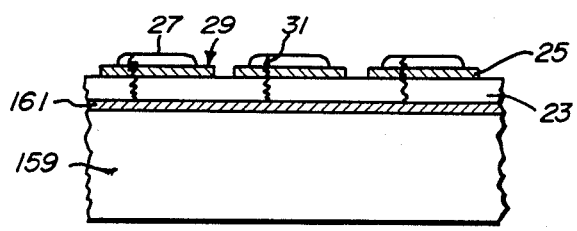
Figure 8E:
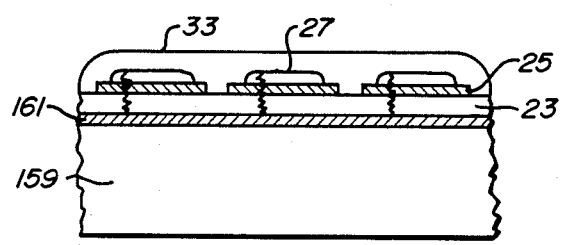
Figure 8F:
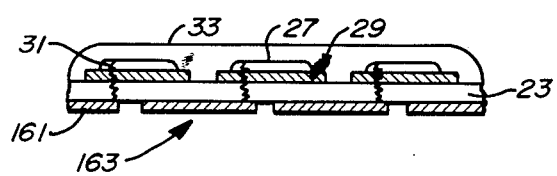
Figure 8G:
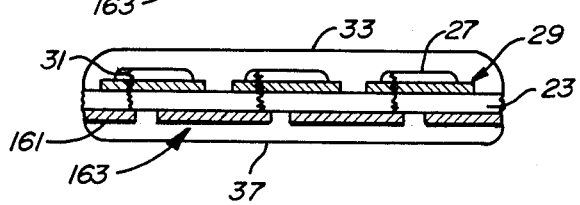

An encapsulant 139, which may include a potting compound in direct contact with islands 131, is applied to the semiconductor side of the structure (FIG. 5E). Encapsulant 139 may be a glass or polymer film and must be transparent to light if the interconnected semiconductor device array comprises photovoltaic cells. With one side of the structure protected by an encapsulant, substrate 121 is etched away between mask islands 129 to form substrate islands 141 and complete the series electrical connection of the array (see FIG. 5F). Electrical contacts 143 and 145 are attached to the extreme opposite substrate islands 129. Finally, as shown in FIG. 5G, the substrate side of the structure has an encapsulant 147 applied to it in the manner and composed of the various alternative constituents already mentioned.

Plan views of a structure that may result from the method just described in relation to FIG. 5 are shown in FIG. 6. In FIG. 6A, a top view is shown; in FIG. 6B, a view from the bottom of the array is shown. As is clear to the skilled person from the figures, two series-connected strings of three devices each are shown. The two series-connected strings are electrically connected in parallel. The parallel connection is achieved by eliminating any mutual electrical isolation of the substrate islands at the ends of each series-connected string. Electrical contacts 135 are as shown in cross-section in FIG. 5, but because of their relatively long depths, the contacts each have three fingers 149 extending over each island 131 of conductive material 125, as shown in FIG. 6. This multiple finger contact configuration allows increased current flow without increased electrical resistance. For the same reason, each contact includes not one, but three channels 133 containing an electrically conductive material such as a silver paste. Obviously, the module of FIG. 6 can be expanded. If the devices are photovoltaic cells, expansions by adding cells in a direction parallel to fingers 149 would result in increased voltage output and addition of cells in the transverse direction would result in increased current flow.

I have been successful in preparing a number of embodiments of the invention having amorphous silicon photovoltaic cells interconnected in an array. A square array 0.3 meters on a side having an active area of about 0.075 square meters was prepared according to the methods depicted in FIGS. 3 and 4. The array included ten parallel-connected strings of p—i—n cells. Each string included twelve series-connected cells. The array produced 1.6 watts of power under AM1 illumination (equivalent to an overhead sun with the terrestrial atmosphere interposed between the sun and the array) with an open circuit voltage of 7 volts, a short circuit current of 640 mA and a fill factor of 0.35. An array produced by the method depicted in FIG. 5 had the same 10 by 12 cell structure and size. A polyester encapsulant about 40 micrometers thick was applied to both sides of the array with a roller. The array weighed 14 grams and produced 300 milliwatts of power under AM1 illumination for a specific power of 21 watts per kilogram. By continuously optimizing the handling techniques just described, I have produced embodiments of the invention according to the methods described above having specific powers as high as 110 watts per kilogram. For storage, the arrays described can be rolled into a tube as small as about 38 millimeters in diameter without damage.

In the embodiments of the invention just described the starting material has included a continuous semiconductor layer deposited on a continuous, unconventionally thin electrically conducting sheet. The term "continuous," as used here, means that the semiconductor and substrate extend over a large area without interruption. The substrates are ordinarily very thin to produce a flexible lightweight array. That is, they are on the order of 125 micrometers thick and may be as thin as 10 micrometers or less when electroformed nickel substrates are used. Such thin foils are difficult, but not impossible, to handle in continuous deposition apparatus such as is described in the patents referenced above. For those machines it is easier to handle continuous substrates on the order of 250 micrometers in thickness. However, such a thick substrate substantially reduces the specific power of a photovoltaic array.

The thick substrate problem can be solved in a number of ways. A substrate of conventional thickness may be used and processed by one of the methods previously described, but with the following modification. Before masking, etching or encapsulating the substrate side of the structure, but preferably after encapsulating the semiconductor side of the structure, the substrate thickness may be reduced to the preferred, unconventional thickness of less than e.g. about 25 micrometers by etching. An example of such a process is shown schematically in FIG. 7 using the steps and reference numbers of FIG. 2. The same technique is applicable to the processing methods shown in FIGS. 1 and 3-5. In the processing steps of FIG. 7, substrate 151 is of conventional thickness through the step of FIG. 7E and all processing steps are the same as those already described for FIG. 2, so there is no need to repeat the description. In the step depicted as FIG. 7F, the substrate is reduced in thickness by chemical etching. Stainless steel substrates may be etched by conventional means with a ferric chloride solution to reduce them to the desired thinness.

I have succeeded in reducing the thickness of a stainless steel substrate from 200 micrometers to 38 micrometers in this way. The resulting structure, which had a 38 micrometer polyester lamination, was quite flexible. Arrays producing specific powers of 60 watts per kilogram can readily be achieved in this manner. In another case, I have successfully reduced a 200 micrometer thick stainless substrate to a thickness of 20 micrometers. That array, having an active area of about 0.074 square meters, and ten parallel-connected strings of twelve series-connected cells each, each cell composed of two series-connected p—i—n devices, produced an open circuit voltage of 18.5 volts and a short circuit current of 260 mA, with a fill factor of 0.46.

In all of the examples just described, the major source of weight is the substrate even though it is unconventionally thin. That weight ultimately limits the specific power output of the array. Therefore, maximizing the specific power of an array according to the invention requires complete removal of the conventional substrate. Some supporting structure is necessary, however, and it is important that the semiconductor layer be protected from the etchant used during the substrate removal. That protection can be provided by first depositing on a support substrate an intermediate layer having a chemical composition that does not react with a support substrate etchant. After other processing, the support substrate is etched away without damage to the intermediate layer. It is known that a reflective surface disposed at the deepest portion of a photovoltaic cell enhances performance by reflecting unabsorbed radiation back through the cell. Thus, if the array consists of photovoltaic cells, the intermediate layer is preferably optically reflective. Such reflecting, protective layers may be formed, for example, of titanium or of a silver-titanium alloy.

A process according to this aspect of the invention is depicted in FIG. 8 using the processing steps and reference numbers of FIG. 2. The same technique may be applied to the processing methods shown in FIGS. 1 and 3-5. In FIG. 8A, the starting material includes a support 159 upon which an etch-resistant reflecting layer 161, such as a titanium alloy, has been deposited. Support 159 may be of conventional substrate thickness or may be unconventionally thin. Reflecting layer 161 is typically a few hundred nanometers in thickness. All the processing steps of FIGS. 8A through 8E are similar to those of FIG. 2 though FIG. 2E, therefore there is no need to repeat their description. In FIG. 8F support substrate 159 is entirely etched away leaving layer 161 as the rear contact and back reflector of the photovoltaic cell. Reflecting layer 161 is divided into islands 163 having their spaces disposed beneath the islands of conductive coating. Electrical contacts (not shown) and encapsulant 37 are applied to reflecting layer 161 as already described with respect to FIG. 2. The result is a very flexible array of interconnected devices with an outstanding specific power, since the mass of a conventional substrate is entirely removed. Reflective layer 161 acts as an unconventional substrate since it is typically, one half of a micrometer or less in thickness.

Still another example of a method of producing an array according to the invention producing an ultimate specific power is illustrated in FIG. 9. The starting structure shown in FIG. 9A includes a support 171, which may be a conventional metallic substrate, upon which a relatively thin insulating layer 173, such as a polyimide approximately 10 micrometers in thickness, has been deposited. A relatively thin, optically reflective layer 175 has been deposited on polyimide 173. Layer 175 may be an aluminum, five percent silicon alloy approximately 250 nanometers in thickness covered with a very thin layer of chromium. The chromium layer may be about 3 nanometers thick. The surface of this particular example of an optically reflective layer is not specular, but rather has a textured appearance that functions well in photovoltaic cells to improve efficiency by reflecting light. The reflective layers may be deposited by conventional means such as by magnetron sputtering at temperatures of about 250° to 300° C.

A semiconductor layer 177, preferably an amorphous silicon alloy, is deposited on reflective layer 175, for example by the continuous glow discharge processes described in the patents identified at the beginning of this disclosure. A conductive coating 179, which is transparent if the array comprises photovoltaic cells, is deposited on semiconductor 177. Coating 179 may be a transparent oxide such as indium tin oxide.

Figure 9A:
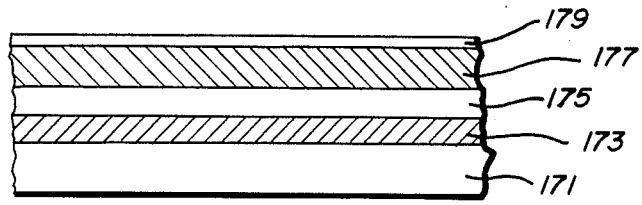
FIGS. 9A through 9E are schematic cross-sectional end views, showing the steps in the fabrication of an interconnected array according to one embodiment of the invention.
Figure 9B:
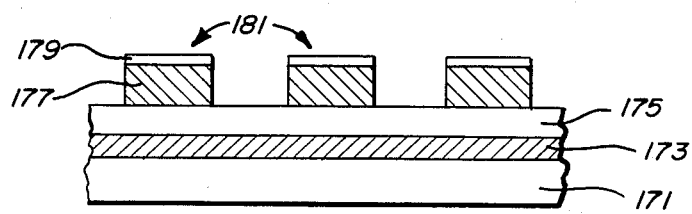
Figure 9C:
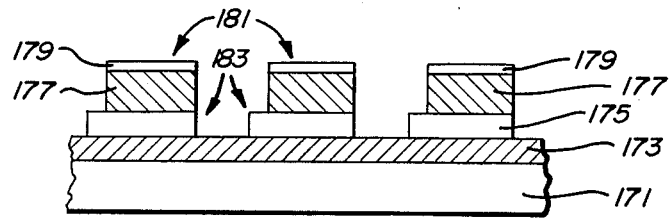
Figure 9D:
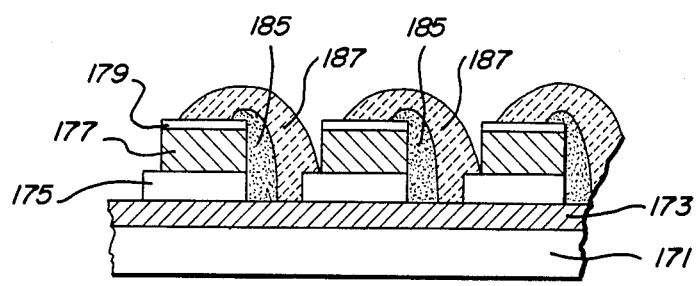
Figure 9E:
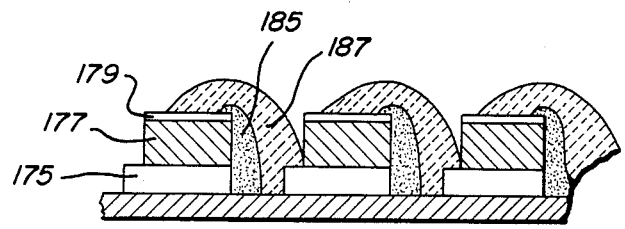

The structure of FIG. 9A is then masked and etched in a conventional manner to form coextensive islands 181 of semiconductor 177 and coating 179 as shown in FIG. 9B. Alternatively, islands 181 may be formed by water jet or laser scribing. In this embodiment, there is no access to reflective layer 175 from the support side of the structure because of the presence of insulator 173. Therefore, islands of the reflective layer 175 for making the electrical contacts must be prepared from the semiconductor side of the structure. As shown in FIG. 9C, islands 183 of reflective layer 175 are formed by known means, such as masking and etching. In the specific example described, the chromium layer is so thin that it is readily penetrated by an etch that attacks the aluminum silicon alloy. A portion of each island 183 is coextensive with one of island 181. An additional portion of each of islands 183 extends from beneath one side of each of islands 181 for making electrical connections. An insulator 185 is then applied to the side of islands 181 from which islands 183 do not extend. Insulator 185 may be a transparent lacquer or other liquid or paste that is screen printed to form a solid, tough insulator. The insulator avoids the short circuiting of cells that would result if any of islands 183 were electrically connected together when the series electrical connections are made. An electrically conducting material 187, such as a silver paste, is screen printed on the top of each island 181 and over insulator 185, to contact the portion of island 183 projecting from the next adjacent island. The contacts thus formed are shown in FIG. 9D electrically connecting the individual cells in series. Finally, to achieve the goal of ultimate specific power, support 171 is entirely removed by etching as indicated in FIG. 9E.

Before support 171 is etched away, the surface of the structure bearing contacts 187 may be encapsulated with a polymer or glassy, preferably transparent, layer that may be preceded by a pottant (neither of which are shown). Electrical contacts are applied at the ends of the series-connected string before laminating the surface bearing contacts 187. Insulator 173 forms a rear encapsulation for the structure without further processing.

For some applications, such as outer space, it is undesirable to use a polymeric front encapsulant because it is attacked by ions. A glassy transparent encapsulant, such as silicon dioxide, silicon nitride or silicon carbide, is required in this application and may be deposited on the array by known chemical vapor deposition or plasma deposition techniques.

Using this ultimate, lightweight array technique just described, I have prepared an array of amorphous silicon alloy photovoltaic cells weighing 67 grams per square meter and generating 33 watts per square meter for a specific power of 492 watts per kilogram.

The invention has been described with respect to certain preferred embodiments. Various modifications and additions within the spirit of the invention will occur to those of the skill in the art. Accordingly, the scope of the invention is limited solely by the following claims.

I claim:

1. A process for producing an electronic device, said process including the steps of:
    providing a substrate member;
    depositing a semiconductor body atop the substrate;
    subjecting the semiconductor body bearing side of the device to further processing steps;
    encapsulating the semiconductor body bearing side;
    subjecting the substrate side of the device to further processing steps; and
    encapsulating the substrate side of the device.

2. A process as in claim 1, wherein the step of subjecting the semiconductor body bearing bearing side of the device to further processing includes depositing an electrically conductive coating on the semiconductor material.

3. A process as in claim 2, wherein the step of depositing an electrically conductive coating comprises selecting said coating from the group consisting essentially of: indium tin oxide, cadmium tin oxide, antimony tin oxide, and combinations thereof.

4. A process as in claim 2, wherein the step of subjecting the semiconductor body bearing side of the device to further processing includes the further step of selectively removing a portion of the semiconductor body and the conductive coating so as to form a plurality of islands of semiconductor material on the substrate.

5. A process as in claim 4, including the further step of providing an electrical connection between the conductive layer of at least one of said plurality of islands and the substrate.

6. A process as in claim 1, wherein the step of subjecting the semiconductor body bearing side of the device to further processing includes patterning the semiconductor body.

7. A process as in claim 1, wherein the step of subjecting the substrate side of the device to further processing includes etching the substrate.

8. A process as in claim 7, wherein the step of etching the substrate comprises reducing the thickness of the substrate to less than 25 micrometers.

9. A process as in claim 7, wherein the step of etching the substrate comprises removing portions of the substrate so as to create a plurality of islands thereof.

10. A process as in claim 1, wherein the step of subjecting the substrate side of the device to further processing includes the step of establishing electrical communication to the substrate.

* * * * *